US011971513B2

(12) United States Patent
He et al.

(10) Patent No.: US 11,971,513 B2
(45) Date of Patent: Apr. 30, 2024

(54) SYSTEM AND METHOD FOR FORMING A SEISMIC VELOCITY MODEL AND IMAGING A SUBTERRANEAN REGION

(71) Applicant: SAUDI ARABIAN OIL COMPANY, Dhahran (SA)

(72) Inventors: Weiguang He, Beijing (CN); Yubing Li, Beijing (CN); Lu Liu, Beijing (CN); Yi Luo, Dhahran (SA)

(73) Assignee: SAUDI ARABIAN OIL COMPANY, Dhahran (SA)

( * ) Notice: Subject to any disclaimer, the term of this patent is extended or adjusted under 35 U.S.C. 154(b) by 294 days.

(21) Appl. No.: 17/326,534

(22) Filed: May 21, 2021

(65) Prior Publication Data

US 2022/0373701 A1  Nov. 24, 2022

(51) Int. Cl.
*G01V 1/28* (2006.01)
*E21B 49/00* (2006.01)
(Continued)

(52) U.S. Cl.
CPC .............. *G01V 1/282* (2013.01); *E21B 49/00* (2013.01); *G01V 1/303* (2013.01); *G01V 1/34* (2013.01);
(Continued)

(58) Field of Classification Search
CPC .......... G01V 1/282; G01V 1/303; G01V 1/34; G01V 2210/6222; G01V 2210/679; G01V 1/301; E21B 49/00; G06F 30/20
See application file for complete search history.

(56) References Cited

U.S. PATENT DOCUMENTS 10,928,534 B2 * 2/2021 Warner ................. G01V 1/364
2006/0265132 A1   11/2006 Rickett
(Continued)

FOREIGN PATENT DOCUMENTS

CN    107422379 A    12/2017
CN    110058307 A    7/2019
(Continued)

OTHER PUBLICATIONS

International Search Report and Written Opinion issued in corresponding International Patent Application No. PCT/US2022/030376, dated Sep. 9, 2022 (16 pages).
(Continued)

*Primary Examiner* — Douglas Kay
(74) *Attorney, Agent, or Firm* — Osha Bergman Watanabe & Burton LLP (57) ABSTRACT

Methods of and systems for forming an image of a subterranean region of interest are disclosed. The method includes obtaining an observed seismic dataset and a seismic velocity model for the subterranean region of interest and generating a simulated seismic dataset based on the seismic velocity model and the source and receiver geometry of the observed seismic dataset. The method also includes forming a plurality of time-windowed trace pairs from the simulated and the observed seismic datasets, and forming an objective function based on a penalty function and a cross-correlation between the members of each pair. The method further includes determining a seismic velocity increment based on the extremum of the objective function and forming an updated seismic velocity model by combining the seismic velocity increment and the seismic velocity model, and forming the image of the subterranean region of interest based on the updated seismic velocity model.

11 Claims, 9 Drawing Sheets

(51) Int. Cl.
*G01V 1/30* (2006.01)
*G01V 1/34* (2006.01)
*G06F 30/20* (2020.01)

(52) U.S. Cl.
CPC ...... *G06F 30/20* (2020.01); *G01V 2210/6222* (2013.01); *G01V 2210/679* (2013.01)

(56) References Cited

U.S. PATENT DOCUMENTS

| | | | |
|---|---|---|---|
| 2009/0132243 A1* | 5/2009 | Suzuki | G10L 21/04 |
| | | | 704/E21.001 |
| 2011/0096627 A1* | 4/2011 | Hill | G01V 1/282 |
| | | | 367/73 |
| 2012/0253758 A1 | 10/2012 | Lazaratos et al. | |
| 2017/0108602 A1 | 4/2017 | Yang et al. | |
| 2017/0131418 A1 | 5/2017 | Wang et al. | |
| 2017/0184746 A1 | 6/2017 | Halliday | |
| 2018/0017690 A1 | 1/2018 | Tan et al. | |
| 2018/0335530 A1 | 11/2018 | Wu et al. | |
| 2019/0302293 A1 | 10/2019 | Zhang et al. | |
| 2020/0165911 A1* | 5/2020 | Thorne | E21B 7/04 |
| 2021/0041589 A1* | 2/2021 | Zhao | G01V 1/282 |

FOREIGN PATENT DOCUMENTS

| | | | |
|---|---|---|---|
| CN | 111427081 A | 7/2020 | |
| WO | 2013009944 A1 | 1/2013 | |
| WO | WO-2013009944 A1 * | 1/2013 | G01V 1/303 |
| WO | 2013/093467 A1 | 6/2013 | |

OTHER PUBLICATIONS

Van Leeuwen, T. et al.; "A correlation-based misfit criterion for wave-equation traveltime tomography"; Geophysical Journal International, vol. 182, 2010, pp. 1383-1394 (12 pages).

* cited by examiner

SYSTEM AND METHOD FOR FORMING A SEISMIC VELOCITY MODEL AND IMAGING A SUBTERRANEAN REGION

BACKGROUND

Seismic surveys are frequently conducted by participants in the oil and gas industry. Seismic surveys are conducted over subterranean regions of interest during the search for, and characterization of, hydrocarbon reservoirs. In seismic surveys, a seismic source generates seismic waves which propagate through the subterranean region of interest are and detected by seismic receivers. Typically, both seismic sources and seismic receivers are located on the earth's surface. The seismic receivers detect and store a time-series of samples of earth motion caused by the seismic waves. The collection of time-series of samples recorded at many receiver locations generated by a seismic source at many source locations constitutes a seismic data set.

To determine earth structure, including the presence of hydrocarbons, the seismic data set may be processed. Processing a seismic data set includes a sequence of steps designed to correct for near-surface effects, attenuate noise, compensate of irregularities in the seismic survey geometry, calculate a seismic velocity model, image reflectors in the subterranean, calculate a plurality of seismic attributes to characterize the subterranean region of interest, and aid in decisions governing if, and where, to drill for hydrocarbons.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In general, in one aspect, embodiments relate to methods of and systems for forming an image of a subterranean region of interest are disclosed. The method includes obtaining an observed seismic dataset and a seismic velocity model for the subterranean region of interest and generating a simulated seismic dataset based on the seismic velocity model and the source and receiver geometry of the observed seismic dataset. The method also includes forming a plurality of time-windowed trace pairs from the simulated and the observed seismic datasets, and forming an objective function based on a penalty function and a cross-correlation between the members of each pair. The method further includes determining a seismic velocity increment based on the extremum of the objective function and forming an updated seismic velocity model by combining the seismic velocity increment and the seismic velocity model, and forming the image of the subterranean region of interest based on the updated seismic velocity model.

In general, in one aspect, embodiments relate to a non-transitory computer readable medium storing instructions executable by a computer processor, the instructions including functionality for obtaining an observed seismic dataset and a seismic velocity model for the subterranean region of interest and generating a simulated seismic dataset based on the seismic velocity model and the source and receiver geometry of the observed seismic dataset. The instructions further include functionality for forming a plurality of time-windowed trace pairs from the simulated and the observed seismic datasets, and forming an objective function based on a penalty function and a cross-correlation between the members of each pair. The instructions still further include functionality for determining a seismic velocity increment based on the extremum of the objective function and forming an updated seismic velocity model by combining the seismic velocity increment and the seismic velocity model, and forming the image of the subterranean region of interest based on the updated seismic velocity model.

In general, in one aspect, embodiments relate to a system for forming an image of a subterranean region of interest including a seismic source to emit a radiated seismic wave, a plurality of seismic receivers for detecting and recording an observed seismic dataset generated by the radiated seismic wave, and a seismic processor. The seismic processor is configured to generate a simulated seismic dataset based on the seismic velocity model and the source and receiver geometry of the observed seismic dataset. The seismic processor is also configured to form a plurality of time-windowed trace pairs from the simulated and the observed seismic datasets, and to form an objective function based on a penalty function and a cross-correlation between the members of each pair. The seismic processor is further configured to determine a seismic velocity increment based on the extremum of the objective function, and to form an updated seismic velocity model by combining the seismic velocity increment and the seismic velocity model, and form the image of the subterranean region of interest based on the updated seismic velocity model.

Other aspects and advantages of the claimed subject matter will be apparent from the following description and the appended claims.

BRIEF DESCRIPTION OF DRAWINGS

Specific embodiments of the disclosed technology will now be described in detail with reference to the accompanying figures. Like elements in the various figures are denoted by like reference numerals for consistency.

DETAILED DESCRIPTION

In the following detailed description of embodiments of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as using the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

Figure 1:
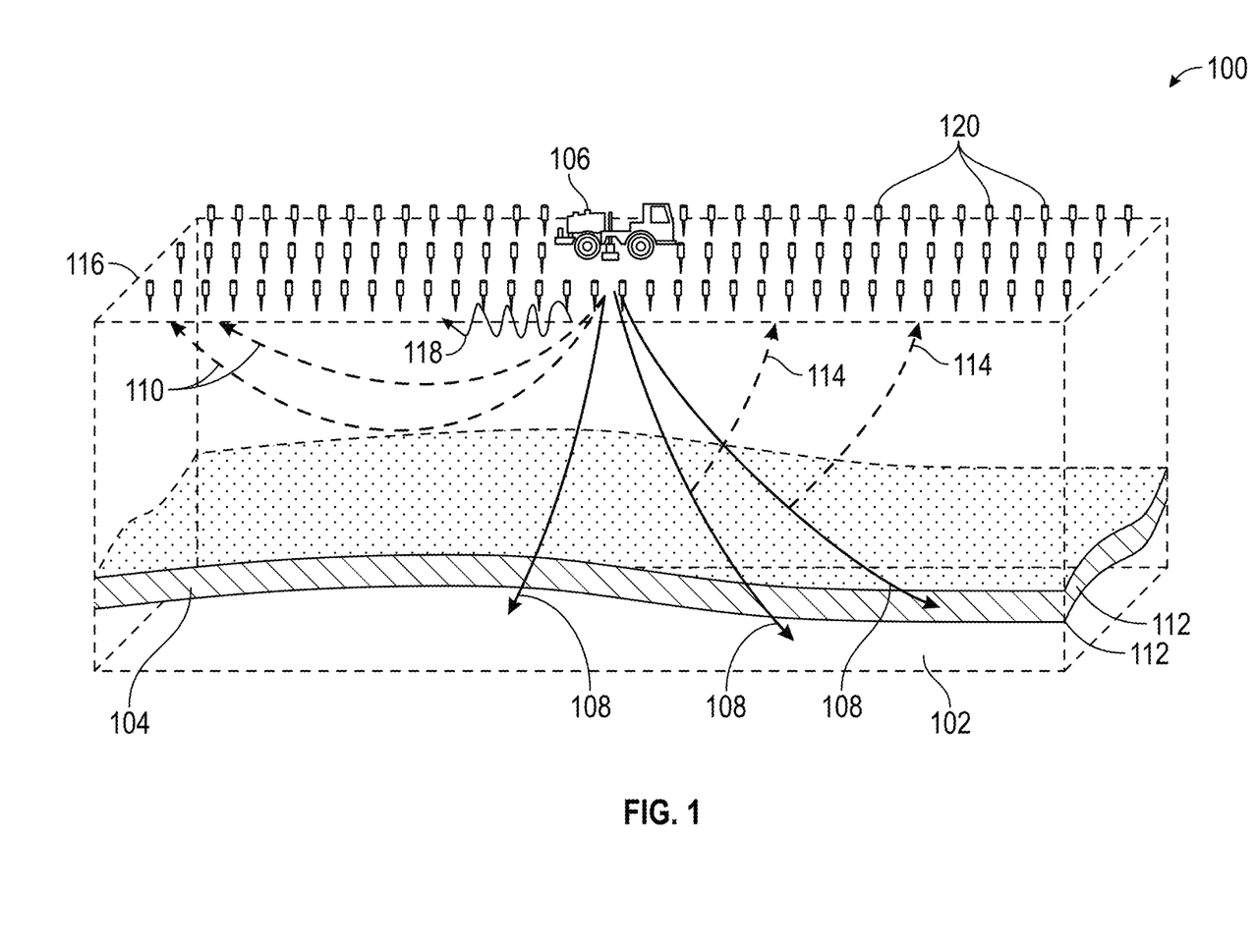
FIG. 1 depicts a seismic survey in accordance with one or more embodiments.

FIG. 1 shows a seismic survey (100) of a subterranean region of interest (102), which may contain a hydrocarbon reservoir (104). In some cases, the subterranean region of interest (102) may lie beneath a lake, sea, or ocean. In other cases, the subterranean region of interest (102) may lie beneath an area of dry land. The seismic survey (100) may utilize a seismic source (106) that generates radiated seismic waves (108). The type of seismic source (106) may depend on the environment in which it is used, for example on land the seismic source (106) may be a vibroseis truck or an explosive charge, but in water the seismic source (106) may be an airgun. The radiated seismic waves (108) may return to the Earth's surface (116) as refracted seismic waves (110) or may be reflected by geological discontinuities (112) and return to the surface as reflected seismic waves (114). The radiated seismic waves may propagate along the surface as Rayleigh waves or Love waves, collectively known as "ground-roll" (118). Vibrations associated with ground-roll (118) do not penetrate far beneath the Earth's surface (116) and hence are not influenced, nor contain information about, portions of the subterranean region of interest (102) where hydrocarbon reservoirs (104) are typically located. Seismic receivers (120) located on or near the Earth's surface (116) detect reflected seismic waves (114), refracted seismic waves (110) and ground-roll (118).

In accordance with one or more embodiments, the refracted seismic waves (110), reflected seismic waves (114), and ground-roll (118) generated by a single activation of the seismic source (106) are recorded by a seismic receiver (120) as a time-series representing the amplitude of ground-motion at a sequence of discreet sample times. Usually the origin of the time-series, denoted t=0, is determined by the activation time of the seismic source (106). This time-series may be denoted a seismic "trace". The seismic receivers (120) are positioned at a plurality of seismic receiver locations which we may denote $(x_r, y_r)$ where x and y represent orthogonal axes on the Earth's surface (116) above the subterranean region of interest (102). Thus, the plurality of seismic traces generated by activations of the seismic source (106) at a single location may be represented as a three-dimensional "3D" volume with axes $(x_r, y_r, t)$ where $(x_r, y_r)$ represents the location of the seismic receiver (116) and t denotes the time sample at which the amplitude of ground-motion was measured.

However, a seismic survey (100) may include recordings of seismic waves generated by a seismic source (106) sequentially activated at a plurality of seismic source locations denoted $(x_s, y_s)$. In some cases, this may be achieved using a single seismic source (106) that is moved to a new location between activations. In other cases, a plurality of seismic sources (106) positioned at different locations may be used. Irrespective of how they are acquired, all the seismic traces acquired by a seismic survey (100) may be represented as a five-dimensional volume, with coordinate axes $(x_s, y_s, x_r, y_r, t)$, and called a "seismic dataset".

When a seismic dataset is acquired by activating physical seismic sources and recording the actual resulting vibrations of the Earth using physical seismic receivers, the seismic dataset may be termed an "observed seismic dataset" and the component seismic traces "observed seismic traces". However, a seismic dataset may be simulated by solving the acoustic, elastic, or viscoelastic wave equations for at least one simulated seismic source and a plurality of seismic receiver locations. Typically, the solving is performed using a large capacity computer system. The resulting seismic dataset may be termed a "simulated seismic dataset" and the component seismic traces "simulated seismic traces".

Figure 2A:
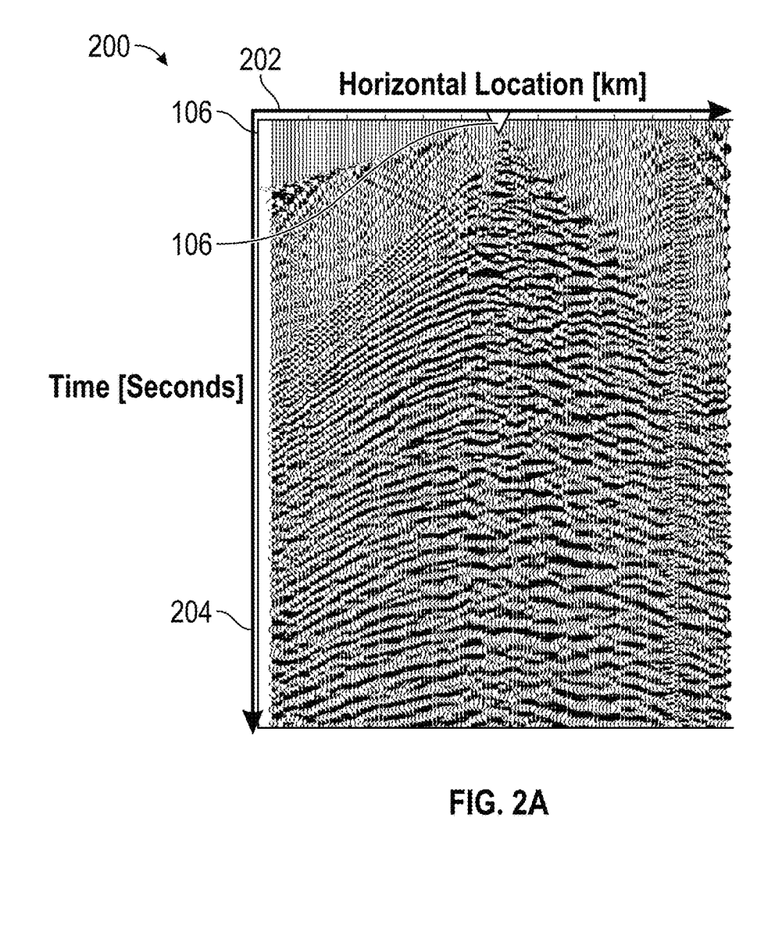
FIG. 2A shows a seismic dataset in accordance with one or more embodiments.
Figure 2B:
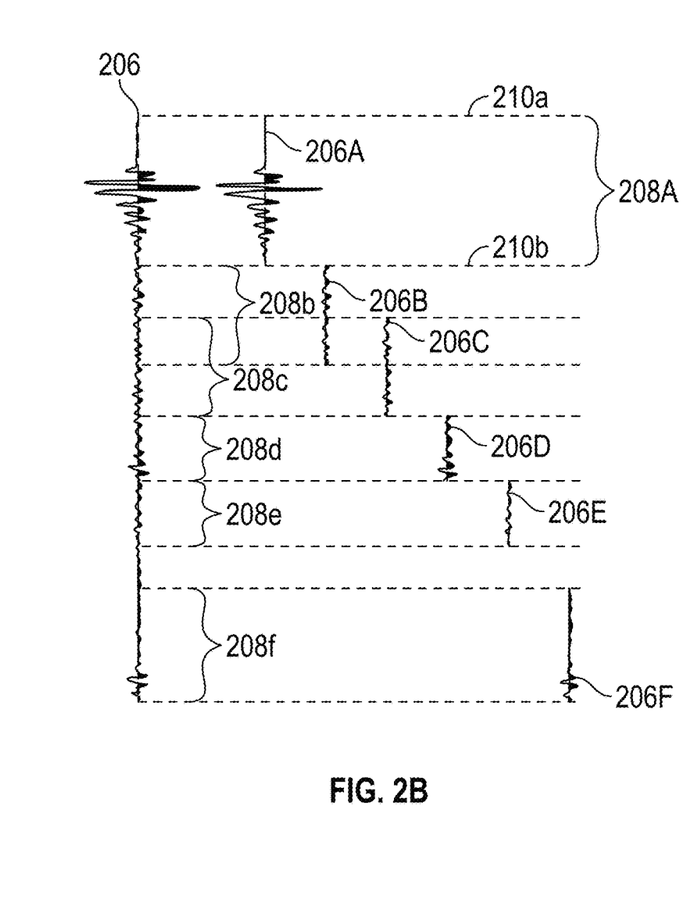
FIG. 2B shows a time-windowed seismic trace in accordance with one or more embodiments.

FIGS. 2A and 2B show a portion of a seismic dataset (200) in accordance with one or more embodiments. The portion of a seismic dataset (200) comprises a plurality of seismic traces (206) for a single seismic source (106) activation position. Each seismic trace (206) runs vertically with the recording time of each sample indicated by the vertical axis (204). In FIG. 2A a plurality of seismic traces (206) is displayed. Each seismic trace is displayed at a position on the horizon axis (202) corresponding to the horizontal location of the seismic receiver (114) that recorded the seismic trace (206).

In accordance with one or more embodiments, the amplitude of a seismic trace (206) can vary significantly over its duration. In some cases, the amplitude at an early time of the seismic trace (206) can be much large than the amplitude at a later time. In other cases, the amplitude at an intermediate or late time can be larger than at early times. Irrespective of at what time in the seismic trace (206) the large amplitudes occur, in accordance with one or more embodiments it may be advantageous to divide each trace into a plurality of time windows (208a-f) each bounded by a start time (210a) and an end time (210b) as shown for the earliest time window (208a). In accordance with some embodiments, the time windows may be overlapping such that some time samples in the seismic trace may lie in a plurality of windows. Time windows (208b) and (208c) are examples of overlapping time windows. In accordance with other embodiments, the time windows may be consecutive but not overlapping, such that the final sample in one time window immediately precedes the first sample in the adjacent time window, with no samples falling between adjacent time windows. Time windows (208a) and (208b) are examples of consecutive time windows, as are time windows (208d) and (208e). In accordance with other embodiments, the time windows may be disjunct, i.e., non-consecutive and non-overlapping. Time windows (208e) and (208f) are examples of non-consecutive and non-overlapping windows. In accordance with still further embodiments, the seismic trace (206) may be divided into any combination of overlapping, consecutive and disjunct time windows.

A seismic dataset (200) may be processed to generate a seismic velocity model of the subterranean region of interest (102) or an image of geological discontinuities (112) within the subterranean region of interest (102). The geological discontinuities (112) may be boundaries between geological layers, the boundaries between different pore fluids, faults, fractures or groups of fractures within the rock. The geological discontinuities (112) may delineate a hydrocarbon reservoir (104).

Processing a seismic data set comprises a sequence of steps designed, without limitation, to correct for near surface effects, attenuate noise, compensate of irregularities in the seismic survey geometry, calculate a seismic velocity model, image reflectors in the subterranean region, calculate a plurality of seismic attributes to characterize the subterranean region of interest (102), and aid in decisions governing where to drill for hydrocarbons. Processing a seismic dataset (200) may involve combining observed seismic traces (206) drawn from an observed seismic dataset with simulated seismic traces drawn from a simulated seismic dataset.

In accordance with one or more embodiments, a seismic velocity model may be updated by calculating a seismic velocity increment and adding the seismic velocity increment to a pre-existing seismic velocity model to produce an updated seismic velocity model. Both the seismic velocity model and the seismic velocity increment may comprise a seismic velocity value at each of a plurality of locations within the subterranean region of interest (102). The seismic velocity values may change only with depth below the Earth's surface (116) or they may also vary along one or more horizontal spatial axes. The seismic velocity increment may be determined such that a simulated seismic dataset calculated for the resulting updated seismic velocity model matches the observed seismic dataset more closely than does the simulated seismic dataset calculated for the pre-existing seismic velocity model.

The matching of the observed and simulated seismic datasets may be performed, in accordance with one or more embodiments, by forming a plurality of trace pairs with one member of each trace pair being an observed seismic trace drawn from the observed seismic dataset and the other member of the trace pair being a simulated seismic trace drawn from the simulated seismic dataset. Both the observed seismic trace and the simulated seismic trace in each trace pair have the same seismic source (106) location and the same seismic receiver (120) location, i.e., the four-dimensional vector $(x_s, y_s, x_r, y_r)$ is the same for both traces in the trace pair. Each trace pair may be divided into a plurality of time windows (208a-e) to produce a plurality of time-windowed trace pair. The start time and the end time of each time window being the same for both members of each trace pair.

In accordance with one or more embodiments, we denote the member of the trace pair drawn from the observed seismic dataset, $d_{ij}$, where the subscript i enumerates the time window and the subscript j enumerates trace pair. Similarly, we denote the member of the trace pair drawn from the simulated seismic dataset, $u_{ij}$, so $\{d_{ij}, u_{ij}\}$ denote a time-windowed trace pair. Each trace pair may be multiplied by a weighing function, $G_{ij}(t, \tau)$, where t denotes time and $\tau$ denotes the time of the center of the time window. The weighting function may decrease in magnitude as the absolute difference between the time sample and the center of the time window, $|t-\tau|$, increase. For example, $G_{ij}(t, \tau)$ may be a Gaussian weighting function given by:

$$G_{ij}(t, \tau) = e^{-\frac{(t-\tau)^2}{2\sigma^2}}. \qquad \text{Equation (1)}$$

The parameter $\sigma$ controls how quickly the weighting function decays as the difference between the time sample, t, and the center of the time window, $\tau$, increases. The value of $\sigma$ may be determined by the dominant period of the seismic wave within the time window. In accordance with some embodiments, the value of $\sigma$ may lie in the range between one and three times the dominant period of the seismic wave within the time window, but in accordance with other embodiments $\sigma$ may lie outside this range. In accordance with one or more embodiments, the time windows used to form the time-windowed trace pairs may be overlapping time windows with a duration equal to $6\sigma$ and a time-shift with respect to the adjacent time windows of $\sigma$. In accordance with one or more embodiments, the value of $\sigma$ may be the same for all time-windowed trace pairs or may be different for different time-windowed trace pairs. Similarly, it will be apparent to one of ordinary skill in the art that the value of $\sigma$, the duration of the time window, and the time-shift between adjacent windows may all be determined differently without departing from the scope of the invention. The time-windowed trace pair after multiplication by the weighting function may be denoted $\{\hat{d}_{ij}, \hat{u}_{ij}\}$ where $\hat{u}_{ij}=u_{ij} G_{ij}(t, \tau)$ and $\hat{d}_{ij}=d_{ij} G_{ij}(t, \tau)$, where there is no summation assumed over the repeated subscripts.

Figure 3A:
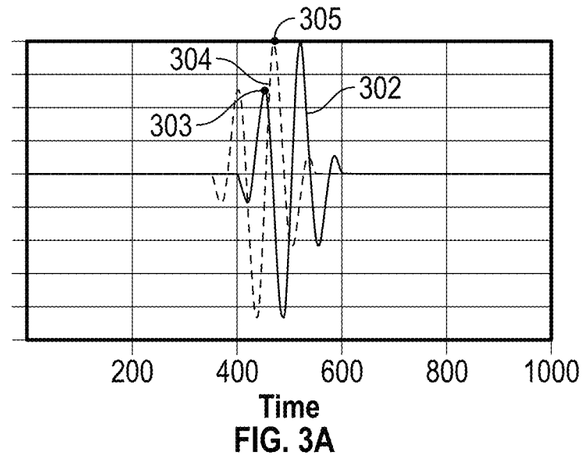
FIG. 3A-3C show cross-correlation functions and a penalty function in accordance with one or more embodiments.
Figure 3B:
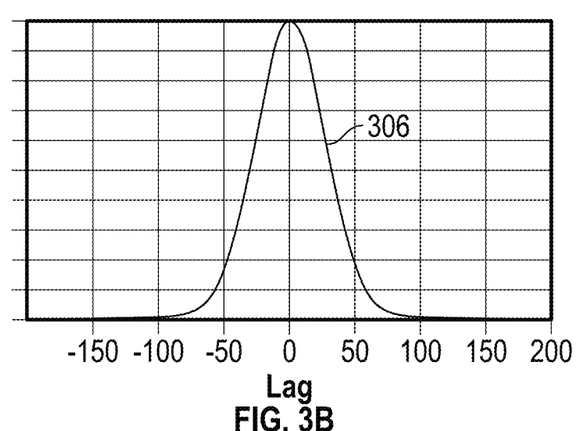

A weighted time-windowed trace pair, $\{\hat{d}_{ij}, \hat{u}_{ij}\}$ is depicted in FIG. 3A in accordance with one or more embodiments. In this depiction, the observed time-windowed trace (302) and the simulated time-windowed trace (304) do not match well. The simulated time-windowed trace (304) is time-shifted when compared to the observed time-windowed trace (302). This time-shift may occur because the seismic velocity model used to simulate the simulated time-windowed trace (304) differs from the true seismic velocities within the subterranean region of interest (102). Since the simulated time-windowed trace (304) occurs earlier in time than the observed time-windowed trace (302) the seismic velocity model may contain seismic velocity values that are on average faster than true seismic velocities within the subterranean region of interest (102). Conversely, if the seismic velocity model used for simulation contained seismic velocity values that are on average slower than true seismic velocities the simulated time-windowed trace (304) may arrive later in time than the observed time-windowed trace (302).

An objective function, $h_{ij}$, may be formed for each time-windowed trace pair, $\{\hat{d}_{ij}, \hat{u}_{ij}\}$. For example, $h_{ij}$, may be formed based on the cross-correlation between $\hat{d}_{ij}$ and $\hat{u}_{ij}$, where the cross-correlation, $c_{ij}$, is given by:

$$c_{ij}(\tau)=\int_0^T \hat{d}_{ij}(t)\hat{u}_{ij}(t-\tau)dt \qquad \text{Equation (2)}$$

and T is the duration of the time window.

In accordance with one or more embodiments, the objective function $h_{ij}$ may be defined to be the zero-lag ($\tau=0$) normalized cross-correlation function:

$$h_{ij} = c_{ij}(\tau = 0)/\max_\tau(c_{ij}). \qquad \text{Equation (3)}$$

Figure 3C:
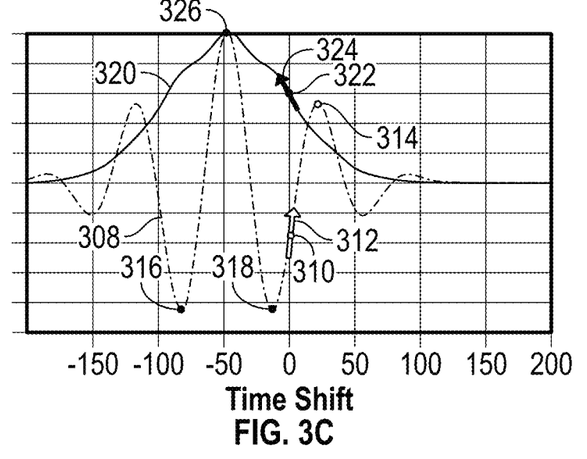

This normalized cross-correlation function for the two time-windowed trace segments (302, 304) is depicted in the FIG. 3C as the dashed line (308). The extremum (326) of the objective function (308) corresponds to a match between the observed (302) and the simulated (304) traces in the time-windowed trace pair. The extremum (326) occurs at a time shift of −50 units, indicating the time shift necessary to align the observed (302) and the simulated (304) traces in the time-windowed trace pair. However, the location of the extremum (326) is not known a priori and calculation of the entire cross-correlation function for all the time-windowed trace pairs is typically computationally infeasible.

Instead, only the zero-time shift value of the normalized cross-correlation function (310) and the gradient or slope (312) of the normalized cross-correlation function is calculated. From this the nearest extremum is found by iteratively determining a seismic velocity increment to be added to the seismic velocity model, recalculating the zero-time shift value of the normalized cross-correlation function (310) and the gradient or slope (312) of the normalized cross-correlation function, and determining a new seismic velocity increment. The iteration terminates when a local extremum (314) is reached. However, this local extremum (314) does not align, or match, the two members of the time-windowed trace pair but rather aligns peaks (303, 305) that are offset from one another by one cycle of the signal. This problematic misalignment of the two members of the time-windowed trace pair is typically known as "cycle-skipping". Cycle-skipping may occur when the members of the time-windowed trace pairs are insufficiently aligned or matched at the beginning of the iterative process. In the example shown in FIG. 3C, if the time-shift falls between the two extrema with the opposite signs (316, 318) lying on either side of the extremum (326) then the iterative process will converge to the extremum (326). The range of time-shifts between (316) and (318) may be called the "basin of attraction".

In accordance with one or more embodiments, a "penalty function", P(t), (306) may be introduced to produce a modified objective function. The modified objective function may be written as:

$$\tilde{h}_{ij}(\hat{d}_{ij}, \hat{u}_{ij}) = \frac{1}{2} \frac{<c|P|c>}{<c|c>} = \frac{1}{2} \frac{\int_{-T}^{T} c^2(t)P(t)dt}{\int_{-T}^{T} c^2(t)dt}.$$

Equation (4)

The purpose of the penalty function (306) may be to broaden the basin of attraction. FIG. 3C shows the objective function (320) given by equation (4) for the time-windowed trace pair (302, 304) and the penalty function (306). As before, it is typically only computationally feasible to calculate the zero-time shift value (322) and the zero-time shift gradient (324) or slope of the objective function. However, the basin of attraction for the objection function (320) is much broader than the basin of attraction for the objection function (308) and consequently the iterative process using the objective function (326) will converge to the extremum even when the initial time-shift between the traces (302) and (304) is much greater than for the objective function (308).

In accordance with one or more embodiments, the preceding description of the objective function $\tilde{h}_{ij}(\hat{d}_{ij}, \hat{u}_{ij})$ for a single time-windowed trace pair maybe extended to include the plurality of time-windows enumerated by the subscript i and the plurality of trace pairs enumerated by the subscript j. For example, an objective function, h, may be formed by summing over i and j:

$$h = \Sigma_{j=1}^{J} \Sigma_i^{I_j} \tilde{h}_{ij}$$

Equation (5)

where J is the number of trace pairs and $I_j$ is the number of time-windows formed from the j-th trace pair. The extremum of the objective function, h, may be determined by forming an adjoint source for each trace pair:

$$k_{ij} = \frac{\partial \tilde{h}_{ij}(\hat{d}_{ij}, \hat{u}_{ij})}{\partial \hat{u}_{ij}},$$

Equation (6)

where there is no summation over the subscripts. Seismic waves excited by the adjoint sources may be simulated as backward-propagating in time using the seismic velocity model of the subterranean region of interest. The seismic velocity increment may be determined from the backward-propagated seismic waves and the simulated forward-propagated in time seismic waves excited by the seismic sources (106). In accordance with one or more embodiments, the seismic velocity increment may be determined using the zero-lag cross-correlation between the simulated backward-propagated seismic waves and the simulated forward-propagated seismic waves. The seismic velocity increment may be multiplied by a scalar before it is added to the seismic velocity model to produce an updated seismic velocity model. The scalar may be determined so that seismic waves simulated in the updated seismic velocity model may generate an extremum of the objective function.

The preceding description has described a case where the extremum (326) is a maximum of the objective function. However, one of ordinary skill in the art will readily appreciate that the objective function may be formed, for example, by multiplying the exemplary objective function by a negative number, or subtracting the exemplary objective function from a large positive number, so that the extremum is a minimum without departing from the scope of the invention.

Figure 4:
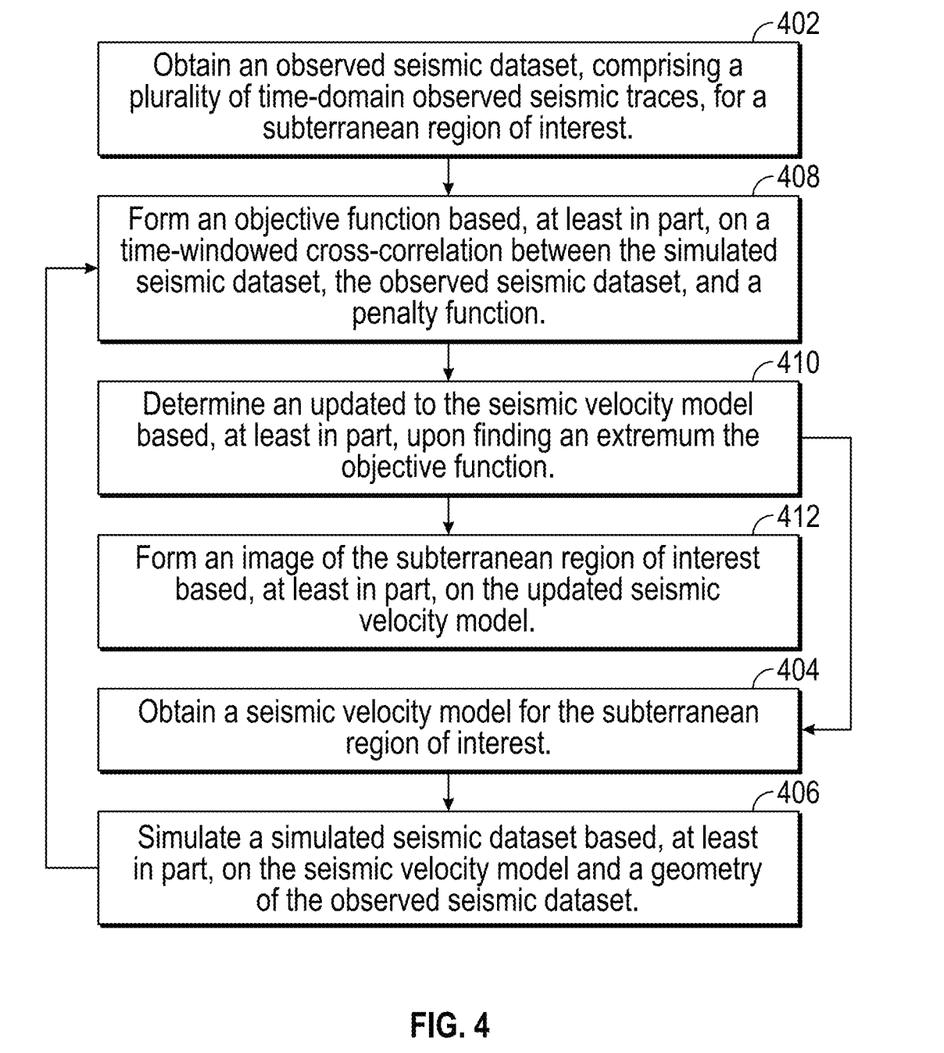
FIG. 4 shows a flowchart in accordance with one or more embodiments.

FIG. 4 shows a flowchart in accordance with one or more embodiments. In Step 402 an observed seismic dataset (200), comprising a plurality of time-domain observed seismic traces (206), for a subterranean region of interest (102) is obtained. The observed seismic dataset (200) may contain a plurality of observed seismic traces (206) recorded for each of a plurality of seismic source (106) excitations. Typically, there may be hundreds of thousands of observed seismic traces (206) for each seismic source (106) excitation and tens of thousands of seismic source excitations in a observed seismic dataset (200).

In Step 404 a seismic velocity model for the subterranean region of interest is obtained. The seismic velocity model may be obtained from acoustic well logs or well seismic datasets. The seismic velocity model may be determined from the observed seismic dataset obtained in Step 402 using approximate methods such as normal moveout analysis, Kirchhoff velocity analysis, or seismic velocity tomography. The seismic velocity model may be obtained from another observed seismic dataset for the subterranean region of interest.

In Step 406, a simulated seismic dataset may be simulated based, at least in part, on the seismic velocity model and a geometry of the observed seismic dataset. Simulating the seismic dataset may involve solving the elastic wave equation or an approximation to the elastic for a plurality seismic source (106) locations drawn from the observed seismic dataset and recording the simulated ground motion for a plurality of seismic receiver (120) locations drawn from the observed seismic dataset.

In Step 408, in accordance with one or more embodiments, an objective function is formed based, at least in part, on a time-windowed cross-correlation between the simulated seismic dataset, the observed seismic dataset, and a penalty function. Step 408 is described below in more detail in connection with FIG. 5.

In Step 410, in accordance with one or more embodiments, an update to the seismic velocity model is determined based, at least in part, upon finding an extremum the objective function. Step 410 is described below in more detail in connection with FIG. 6.

In Step 412, an image of the subterranean region of interest may be formed in accordance with one or more embodiments. The image may be formed by numerically simulating the forward-propagation of seismic waves generated by the seismic source (106) at a plurality of locations through an updated seismic velocity model and numerically simulating the backward-propagation of seismic waves observed at the plurality of seismic receivers (120) through an updated seismic velocity model. Further, the image may be formed by combining the forward-propagated seismic waves and the backward-propagated seismic waves at a plurality of positions within the subterranean region of interest using an imaging condition. In accordance with one or more embodiments, the imaging condition may be a zero-lag cross-correlation coefficient.

Figure 5:
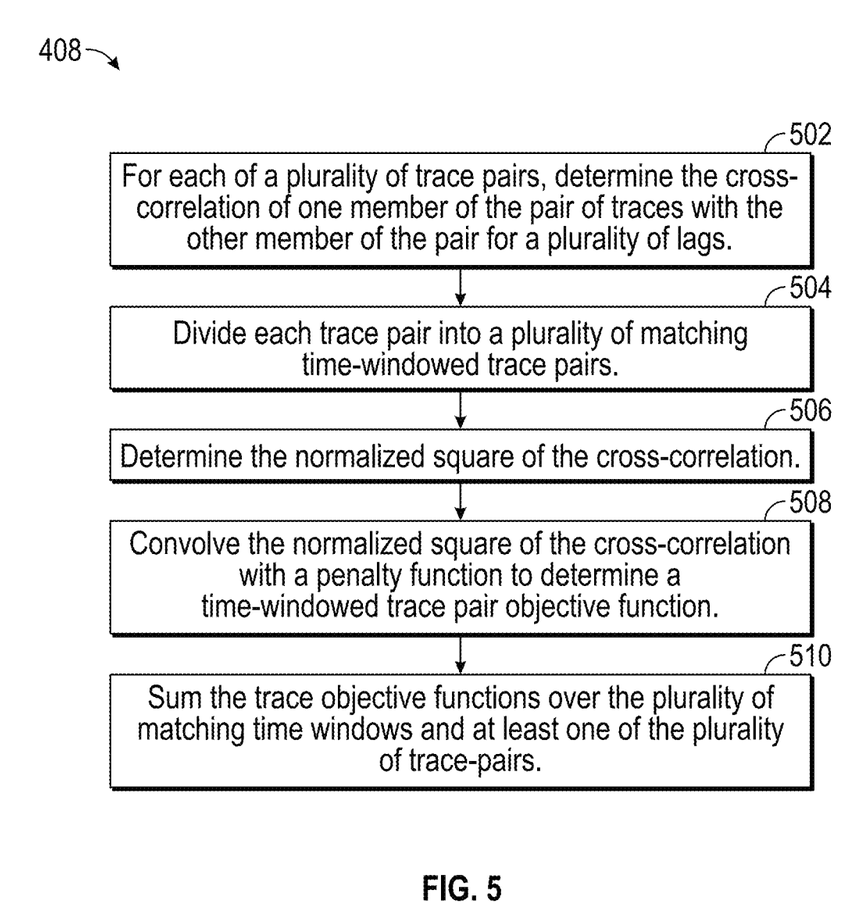
FIG. 5 shows a flowchart in accordance with one or more embodiments.

FIG. 5 shows a flowchart describing the formation of an objective function in accordance with one or more embodiments. In Step 502 a plurality of trace pairs is formed by selecting a seismic trace from the observed seismic dataset and a seismic trace from the simulated seismic trace. Both the observed trace and the simulated trace in each trace pair share the same seismic source (106) location and the same seismic receiver (120) location.

In Step 504 each trace pair may be divided into a plurality of time-windowed trace pairs, in accordance with one or more embodiment. Each member of a time-windowed trace pair should begin and end at the same recording time as the other member of the time-windowed trace pair begins and ends. Further, according to one or more embodiments each time-windowed trace pair may be multiplied by a weighting function that decreases the amplitude of the trace pair near the beginning and near the end relative to the amplitude near the central time of the trace pair. In accordance with some embodiments, the weighting function may be given by equation (1). In accordance with one or more embodiments, the time-windowed trace pairs may be overlapping. In accordance with other embodiments, the time windows may be consecutive but not overlapping.

In Step 506, the normalized square of the cross-correlation may be determined in accordance with equation (2). In Step 508 the normalized square of the cross-correlation may be convolved with a penalty function to determine a time-windowed trace pair objective function. The penalty function may have a peak value and have values that decay with separation from the sample with this peak value. The penalty function is designed to broaden the basin of attraction and may have one or many functional forms familiar to those of ordinary skill in the art, such as a Gaussian, a binomial distribution, or a Poisson distribution.

In Step 510, the time-windowed trace pair objective functions may be summed over the plurality if time windows and over the plurality of trace pairs in accordance with equation (5). In accordance with one or more embodiments the summation may be over all of the plurality if time windows and over all of the plurality of trace pairs. In accordance with other embodiments, the summation may be only over a subset of the plurality if time windows and over a subset of the plurality of trace pairs. In accordance with some embodiments, the time-windowed trace pair objective functions may be multiplied with a weight before summation. The weight may be based, at least in part, on the distance between the seismic source (106) location and the seismic receiver (120) location or on the start and end time of the time window.

Figure 6:
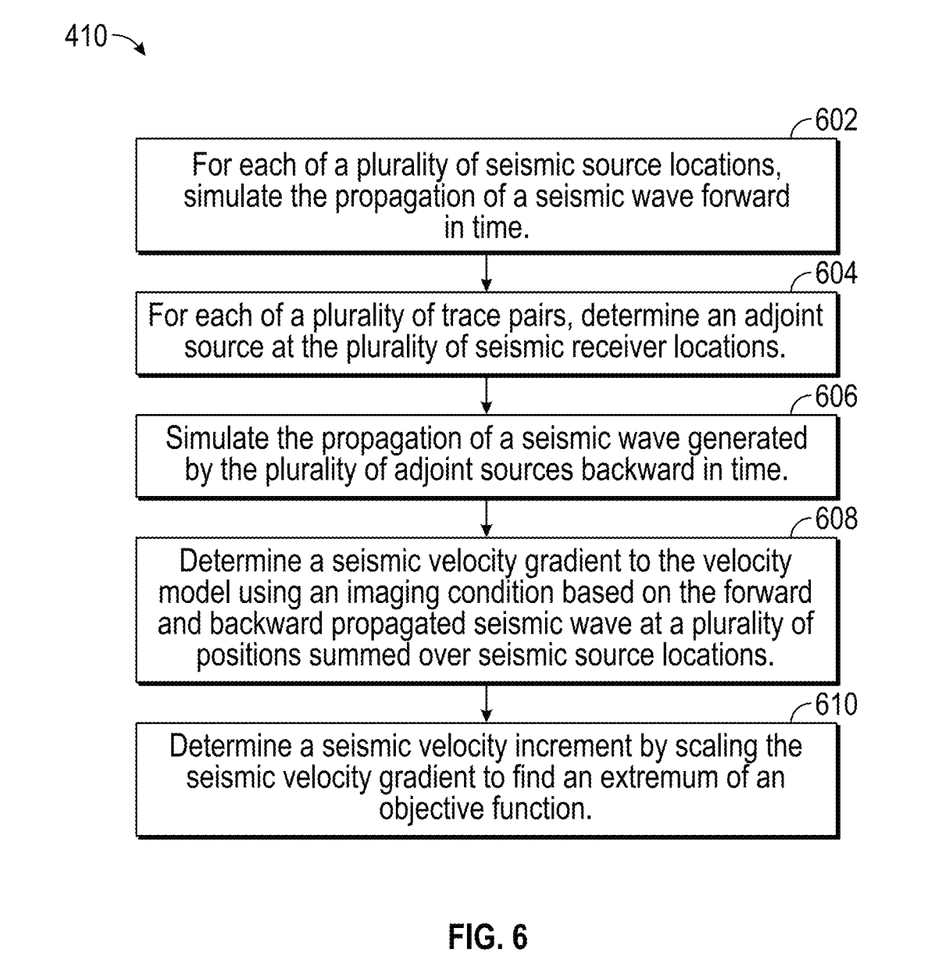
FIG. 6 shows a flowchart in accordance with one or more embodiments.

FIG. 6 shows a flowchart for updating to the seismic velocity model, in accordance with one or more embodiments. In Step 602, the seismic wave excited by the seismic source (106) at a plurality of seismic source location may be simulated propagating forward in time. The simulation may be based, at least in part, on solving the elastic wave equation or an approximation to the elastic wave equation for each of the seismic source locations sequentially.

In Step 604, the adjoint source for each member of the plurality of time-windowed trace pairs may be determined at the location of the seismic receiver corresponding to the trace pair. In accordance with one or more embodiments, the adjoint source may be based, at least in part, on the difference between a simulated seismic trace and an observed seismic trace. Further, the adjoint source may be determined using equation (6).

In Step 606 the seismic waves excited by the plurality of adjoint source may be simulated propagating backward in time. In accordance with one or more embodiment, the backward in time simulation may be performed sequentially for the adjoint source formed from each time windowed pair. In accordance with other embodiments, the backward in time simulation may be performed simultaneously for the adjoint sources associated for all the time-windowed trace pairs determined from a single trace pair. In still other embodiments, the backward in time simulation may be performed simultaneously for all the adjoint source determined from all the trace pairs depending on a single activation of a seismic source (106).

In Step 608, a gradient of the seismic velocity model may be determined by applying an imaging condition combining the forward-propagated and backward-propagated simulated seismic waves at a plurality of positions in the subterranean region of interest. The seismic velocity gradient may be calculated by summing the contributions to seismic velocity gradient coming from each activation of the seismic source (106) at a plurality of locations.

In Step 610, in accordance with one or more embodiments, a seismic velocity increment may be determined by scaling the seismic velocity gradient to find an extremum of an objective function. In some embodiments, the extremum may be a maximum and in other embodiments the extremum may be a minimum. The scaling may include multiplication of the seismic velocity gradient by a scalar. The scaling may further include spatial smoothing and/or low-pass spatial filtering in one, two, or three spatial dimensions.

Figures 7A, 7B:
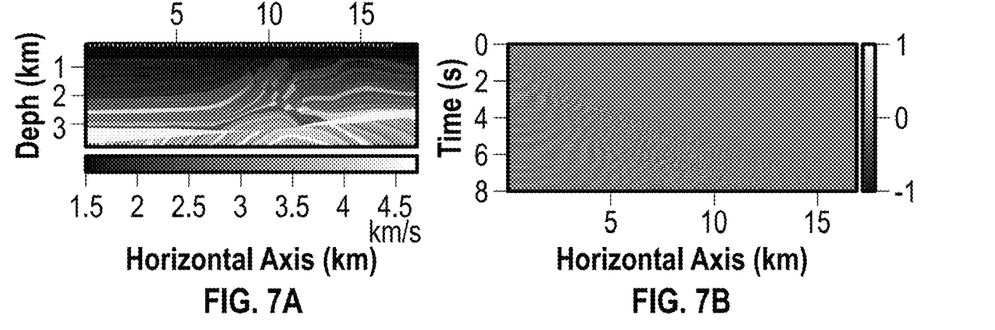
FIGS. 7A-7G show an example application in accordance with one or more embodiments.

FIGS. 7A-7E show the intermediate results of applying the workflow depicted in FIG. 4. To improve the pedagogical value of this example the observed seismic data is itself simulated numerically using a 2D numerical model of a subterranean region shown in FIG. 7A. This numerically simulated observed dataset, shown in FIG. 7B, will be termed and "observed seismic dataset" in this exemplary description, even though it is in fact simulated for a 2D seismic velocity model. Similarly, the 2D seismic velocity model, shown in FIG. 7A, will be termed the "true seismic velocity model" throughout the description of FIGS. 7A-7E. The true seismic velocity model shown in FIG. 7A represents a vertical plane through the subsurface covering the range 0-4 km. The horizontal axis represents horizontal position covering the range of 0-18 km. The grayscale represents seismic velocity ranging between 1.5 and 4.7 km/s. This is a typical range of seismic velocities encountered in the subsurface. The red triangles located on the surface represent the seismic receiver (120) locations.

FIG. 7B depicts an example of an observed seismic dataset recorded by the plurality of seismic receivers (120) as a function of time after the activation of the seismic source (106). Time is represented on the vertical axis and the seismic receiver (120) location on the horizontal axis. The amplitudes of the observed seismic dataset are represented by the grayscale on a normalized scale from −1 to 1 amplitude units.

Figures 7C, 7D:
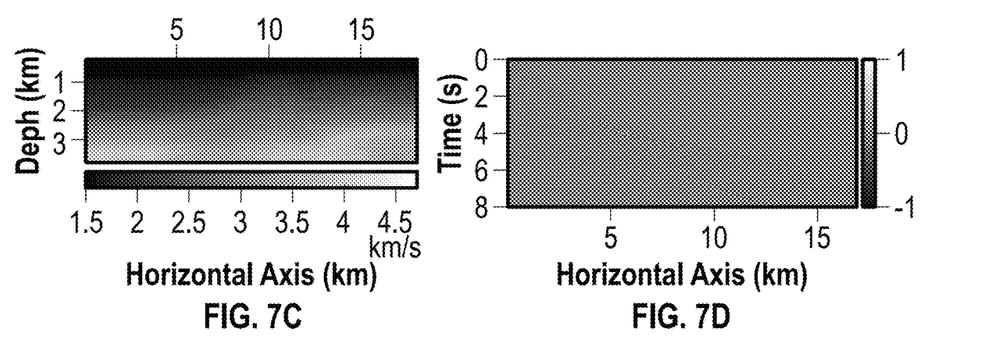

FIG. 7C represents the seismic velocity model obtained in Step 404 of FIG. 4. In this example, this starting seismic velocity model is a smoothed approximation to the true seismic velocity model shown in FIG. 7A. The axes and grayscale of FIG. 7C are identical to those of FIG. 7A.

FIG. 7D shows the simulated seismic dataset based, at least in part, on the seismic velocity model shown in FIG. 7C and the seismic source (106) and seismic receiver (120) geometry of the simulated seismic dataset shown in FIG. 7B. The simulated seismic dataset shown in FIG. 7D is clearly different from the observed seismic dataset shown in FIG. 7B. This difference is used by the workflow depicted in FIG. 4 to generate the updated seismic velocity model.

Figures 7E, 7F:
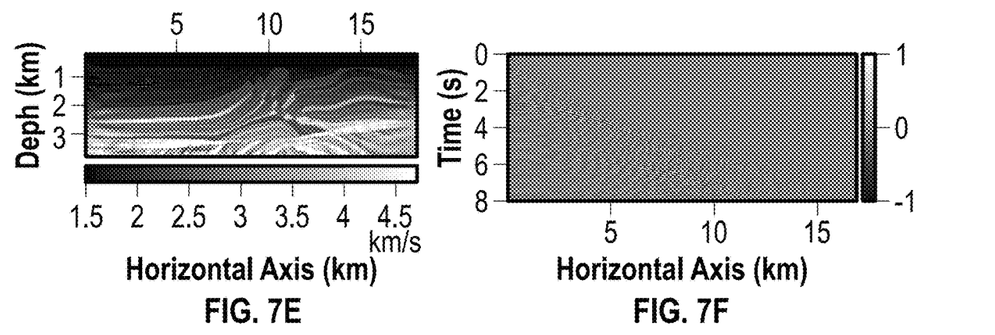

FIG. 7E shows the updated seismic velocity model obtained by applying the Steps 402, 404, 406, 408 and 410 to the difference between the observed and the simulated seismic datasets. While not identical to the true seismic velocity model shown in FIG. 7A, the updated seismic velocity model shown in FIG. 7E is much more similar to the true seismic velocity model than the starting velocity model shown in FIG. 7C.

FIG. 7F displays the simulated seismic dataset based, at least in part, on the updated seismic velocity model shown in FIG. 7E and the seismic source (106) and seismic receiver (120) geometry of the simulated seismic dataset shown in FIG. 7B. The simulated seismic dataset for the updated seismic velocity model displayed in FIG. 7F is much more similar to the synthetic seismic dataset shown in FIG. 7B than is the simulated seismic dataset for the starting seismic velocity model displayed in FIG. 7D.

Figure 7G:
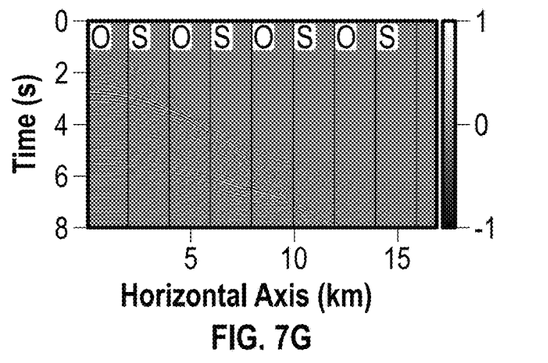

The similarity between the observed seismic dataset shown in FIG. 7B and the simulated seismic dataset for the updated seismic velocity model shown in FIG. 7F is further displayed in FIG. 7G where alternating segments of the observed seismic dataset, marked "O", and the simulated seismic dataset, marked "S", are interleaved.

Figure 8:
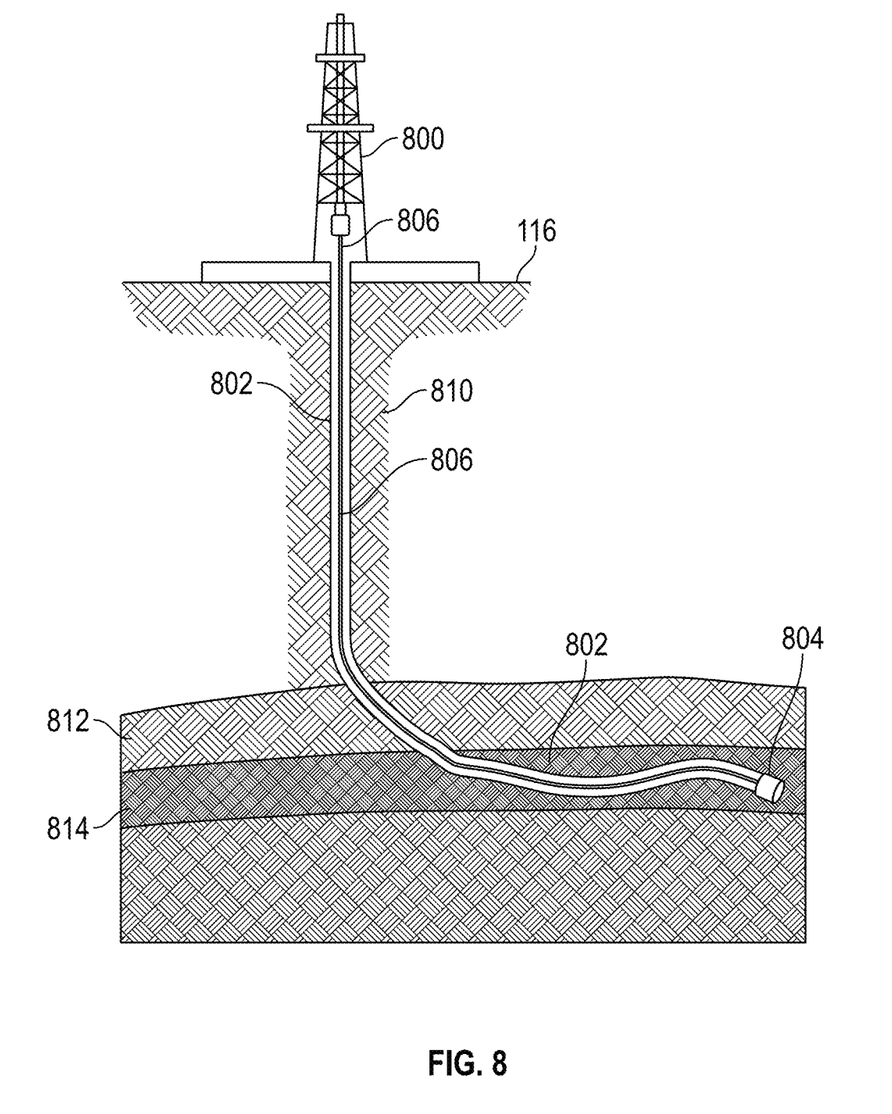
FIG. 8 shows a system in accordance with one or more embodiments.

FIG. 8 illustrates systems in accordance with one or more embodiments. As shown in FIG. 8, a well (802) may be drilled by a drill bit (904) attached by a drillstring (806) to a drill rig (808) located on the Earth's surface (116). The well may traverse a plurality of overburden layers (810) and one or more cap-rock layers (812) to a hydrocarbon reservoir (814). In accordance with one or more embodiments, the updated seismic velocity model, as shown in FIG. 7E, may be used to plan and drill the curved well path. An image of the subterranean region of interest may formed using the updated seismic velocity model and the observed seismic dataset, shown in FIG. 7B, and the curved well path may be planned based, at least in part, on the image.

Figure 9:
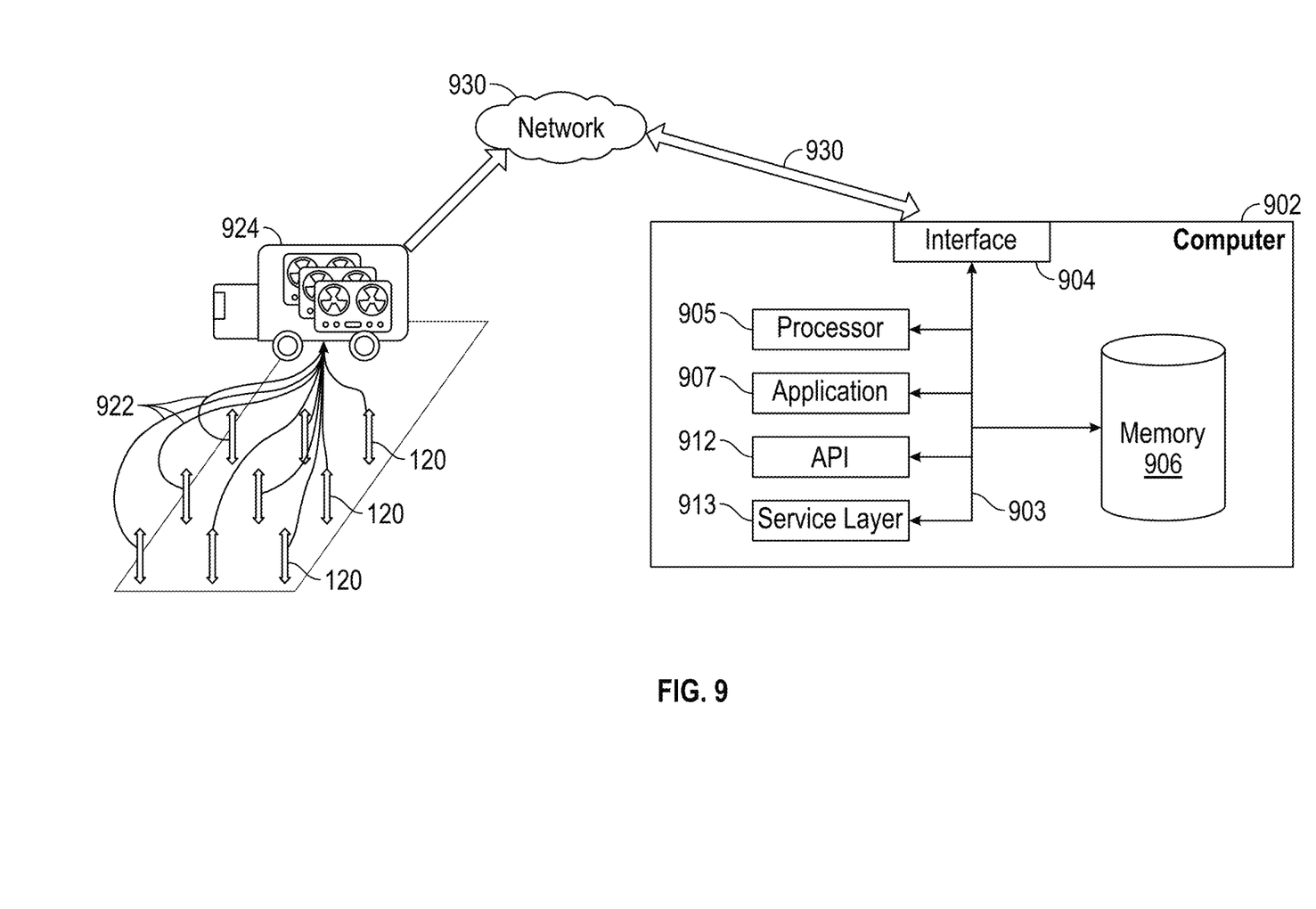
FIG. 9 shows a system in accordance with one or more embodiments.

FIG. 9 shows a seismic recording and processing system, in accordance with one or more embodiments. The data recorded by a plurality of seismic receivers (120) may be transmitted to a seismic recording facility (924) located in the neighborhood of the seismic survey (100). The seismic recording facility may be one or more seismic recording trucks (924). The plurality of seismic receivers (120) may be in digitally or analogic telecommunication with the seismic recording facility (924). The telecommunication may be performed over telemetry channels (922) that may be electrical cables, such as coaxial cables, or may be performed wireless using wireless systems, such as Wi-Fi or Bluetooth. Digitization of the seismic data may be performed at each seismic receiver (120), or at the seismic recording facility (924), or at an intermediate telemetry node (not shown) between the seismic receiver (120) and the seismic recording facility (924).

The seismic data may be recorded at the seismic recording facility (924) and stored on non-transitory computer memory. The computer memory may be one or more computer hard-drives, or one or more computer memory tapes, or any other convenient computer memory media familiar to one skilled in the art. The seismic data may be transmitted to a computer (902) for processing. The computer (902) may be located in or near the seismic recording facility (924) or may be located at a remote location, that may be in another city, country, or continent. The seismic data may be transmitted from the seismic recording facility (924) to a computer (902) for processing. The transmission may occur over a network (930) that may be a local area network using an ethernet or Wi-Fi system, or alternatively the network (930) may be a wide area network using an internet or intranet service. Alternatively, seismic data may be transmitted over a network (930) using satellite communication networks. Most commonly, because of its size, seismic data may be transmitted by physically transporting the computer memory, such as computer tapes or hard drives, in which the seismic data is stored from the seismic recording facility (902) to the location of the computer (902) to be used for processing.

FIG. 9 further depicts a block diagram of a computer system (902) used to provide computational functionalities associated with described algorithms, methods, functions, processes, flows, and procedures as described in this disclosure, according to one or more embodiments. The illustrated computer (902) is intended to encompass any computing device such as a server, desktop computer, laptop/notebook computer, wireless data port, smart phone, personal data assistant (PDA), tablet computing device, one or more processors within these devices, or any other suitable processing device, including both physical or virtual instances (or both) of the computing device. Additionally, the computer (902) may include a computer that includes an input device, such as a keypad, keyboard, touch screen, or other device that can accept user information, and an output device that conveys information associated with the operation of the computer (902), including digital data, visual, or audio information (or a combination of information), or a GUI.

The computer (902) can serve in a role as a client, network component, a server, a database or other persistency, or any other component (or a combination of roles) of a computer system for performing the subject matter described in the instant disclosure. The illustrated computer (902) is communicably coupled with a network (930). In some implementations, one or more components of the computer (902) may be configured to operate within environments, including cloud-computing-based, local, global, or other environment (or a combination of environments).

At a high level, the computer (902) is an electronic computing device operable to receive, transmit, process, store, or manage data and information associated with the described subject matter. According to some implementations, the computer (902) may also include or be communicably coupled with an application server, e-mail server, web server, caching server, streaming data server, business intelligence (BI) server, or other server (or a combination of servers).

The computer (902) can receive requests over network (930) from a client application (for example, executing on another computer (902)) and responding to the received requests by processing the said requests in an appropriate software application. In addition, requests may also be sent to the computer (902) from internal users (for example, from a command console or by other appropriate access method), external or third-parties, other automated applications, as well as any other appropriate entities, individuals, systems, or computers.

Each of the components of the computer (902) can communicate using a system bus (903). In some implementations, any or all of the components of the computer (902), both hardware or software (or a combination of hardware and software), may interface with each other or the interface (904) (or a combination of both) over the system bus (903) using an application programming interface (API) (912) or a service layer (913) (or a combination of the API (912) and service layer (913). The API (912) may include specifications for routines, data structures, and object classes. The API (912) may be either computer-language independent or dependent and refer to a complete interface, a single function, or even a set of APIs. The service layer (913) provides software services to the computer (902) or other components (whether or not illustrated) that are communicably coupled to the computer (902). The functionality of the computer (902) may be accessible for all service consumers using this service layer. Software services, such as those provided by the service layer (913), provide reusable, defined business functionalities through a defined interface. For example, the interface may be software written in JAVA, C++, or other suitable language providing data in extensible markup language (XML) format or another suitable format. While illustrated as an integrated component of the computer (902), alternative implementations may illustrate the API (912) or the service layer (913) as stand-alone components in relation to other components of the computer (902) or other components (whether or not illustrated) that are communicably coupled to the computer (902). Moreover, any or all parts of the API (912) or the service layer (913) may be implemented as child or sub-modules of another software module, enterprise application, or hardware module without departing from the scope of this disclosure.

The computer (902) includes an interface (904). Although illustrated as a single interface (904) in FIG. 9, two or more interfaces (904) may be used according to particular needs, desires, or particular implementations of the computer (902). The interface (904) is used by the computer (902) for communicating with other systems in a distributed environment that are connected to the network (930). Generally, the interface (904 includes logic encoded in software or hardware (or a combination of software and hardware) and operable to communicate with the network (930). More specifically, the interface (904) may include software supporting one or more communication protocols associated with communications such that the network (930) or interface's hardware is operable to communicate physical signals within and outside of the illustrated computer (902).

The computer (902) includes at least one computer processor (905). Although illustrated as a single computer processor (905) in FIG. 9, two or more processors may be used according to particular needs, desires, or particular implementations of the computer (902). Generally, the computer processor (905) executes instructions and manipulates data to perform the operations of the computer (902) and any algorithms, methods, functions, processes, flows, and procedures as described in the instant disclosure.

The computer (902) also includes a memory (906) that holds data for the computer (902) or other components (or a combination of both) that can be connected to the network (930). For example, memory (906) can be a database storing data consistent with this disclosure. Although illustrated as a single memory (906) in FIG. 9, two or more memories may be used according to particular needs, desires, or particular implementations of the computer (902) and the described functionality. While memory (906) is illustrated as an integral component of the computer (902), in alternative implementations, memory (906) can be external to the computer (902).

The application (907) is an algorithmic software engine providing functionality according to particular needs, desires, or particular implementations of the computer (902), particularly with respect to functionality described in this disclosure. For example, application (907) can serve as one or more components, modules, applications, etc. Further, although illustrated as a single application (907), the application (907) may be implemented as multiple applications (907) on the computer (902). In addition, although illustrated as integral to the computer (902), in alternative implementations, the application (907) can be external to the computer (902).

There may be any number of computers (902) associated with, or external to, a computer system containing computer (902), wherein each computer (902) communicates over network (930). Further, the term "client," "user," and other appropriate terminology may be used interchangeably as appropriate without departing from the scope of this disclosure. Moreover, this disclosure contemplates that many users may use one computer (902), or that one user may use multiple computers (902).

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims. In the claims, any means-plus-function clauses are intended to cover the structures described herein as performing the recited function(s) and equivalents of those structures. Similarly, any step-plus-function clauses in the claims are intended to cover the acts described here as performing the recited function(s) and equivalents of those acts. It is the express intention of the applicant not to invoke 35 U.S.C. § 112(f) for any limitations of any of the claims herein, except for those in which the claim expressly uses the words "means for" or "step for" together with an associated function.

What is claimed is:

1. A method, comprising:
   obtaining, using a seismic acquisition system, an observed seismic dataset pertaining to a subterranean region of interest, wherein the seismic acquisition system comprises a seismic source and a plurality of seismic receivers;
   using a seismic data processor:
      obtaining a seismic velocity model for the subterranean region of interest,
      determining a simulated seismic dataset based, at least in part, on the seismic velocity model and on a source and receiver geometry of the observed seismic dataset,
      forming a plurality of time-windowed trace pairs, wherein a first member of each pair is drawn from the simulated seismic dataset and a second member of each pair is drawn from the observed seismic dataset,
      forming an objective function based, at least in part, on a penalty function and a cross-correlation between the first member and the second member of each of the plurality of time-windowed trace pairs,
      finding an extremum of the objective function, determining a seismic velocity increment based, at least in part, on the extremum, forming an updated seismic velocity model by combining the seismic velocity increment and the seismic velocity model, forming a seismic image of the subterranean region of interest based, at least in part, on the updated seismic velocity model, and identifying a drilling target based, at least in part, on the seismic image of the subterranean region of interest, wherein the drilling target comprises a portion of the subterranean region of interest with a likelihood of containing oil and gas;

determining a well path through the subterranean region of interest based, at least in part, on the drilling target; and drilling, using a drilling system, a well guided by the well path.

2. The method of claim 1, wherein forming the plurality of time-windowed trace pairs comprises:

selecting a source location and a receiver location;

forming a trace pair by selecting, as the first member of the trace pair, a seismic trace from the observed seismic dataset and selecting, as the second member of the trace pair, a seismic trace from the simulated seismic dataset, wherein both the first member and the second member have the selected source location and the selected receiver location; and forming the plurality of time-windowed trace pairs by dividing the first member and the second member of the trace pair into a plurality of time segments.

3. The method of claim 2, wherein the plurality of time segments comprises a plurality of overlapping time segments wherein each sample within each overlapping time segment is multiplied by a time-varying weight.

4. The method of claim 1, wherein forming the objective function comprises:

calculating a normalized cross-correlation function between the first member and the second member of each time-windowed trace pair;

convolving a square of the normalized cross-correlation function for each time-windowed trace pair with the penalty function to form an objective function increment; and summing the objective function increments over the plurality of time-windowed trace pairs.

5. The method of claim 1, wherein the penalty function has an absolute magnitude that decreases monotonically with time from a peak value.

6. The method of claim 1, wherein determining the seismic velocity increment comprises:

simulating propagation of a seismic wave forward in time for each of a plurality of source locations;

determining an adjoint source for each of the plurality of time-windowed trace pairs;

simulating, for each of the plurality of time-windowed trace pairs, propagation of a seismic wave generated by the adjoint source backward in time;

determining a plurality of seismic velocity gradient increments using an imaging condition based, at least in part, on the forward propagated seismic wave and the backward propagated seismic wave;

obtaining a seismic velocity gradient by combining the plurality of seismic velocity gradient increments; and determining the seismic velocity increment by scaling the seismic velocity gradient based, at least in part, on the extremum of the objective function.

7. A system, comprising:

a seismic acquisition system, comprising:

a seismic source, configured to emit a radiated seismic wave, and a plurality of seismic receivers, configured to detect and record an observed seismic dataset generated by the radiated seismic wave; and a seismic data processor configured to:

receive, from the seismic acquisition system, an observed seismic dataset for a subterranean region of interest, obtain a seismic velocity model for the subterranean region of interest, determine a simulated seismic dataset based, at least in part, on the seismic velocity model and on a source and receiver geometry of the observed seismic dataset, form a plurality of time-windowed trace pairs, wherein a first member of each pair is drawn from the simulated seismic dataset and a second member of each pair is drawn from the observed seismic dataset, form an objective function based, at least in part, on a penalty function and a cross-correlation between the first member and the second member of each of the plurality of time-windowed trace pairs, find an extremum of the objective function, determine a seismic velocity increment based, at least in part, on the extremum, form an updated seismic velocity model by combining the seismic velocity increment and the seismic velocity model, form a seismic image of the subterranean region of interest based, at least in part, on the updated seismic velocity model, identify a portion of the subterranean region of interest with a likelihood of containing oil and gas based, at least in part, on the seismic image of the subterranean region of interest, and using the updated seismic velocity model, plan a well path through the subterranean region of interest based, at least in part, on the identified portion of the subterranean region of interest; and a drilling system, configured to drill a well guided by the planned well path.

8. The system of claim 7, wherein forming the plurality of time-windowed trace pairs comprises:

selecting a source location and a receiver location;

forming a trace pair by selecting, as the first member of the trace pair, a seismic trace from the observed seismic dataset and selecting, as the second member of the trace pair, a seismic trace from the simulated seismic dataset, wherein both the first member and the second member have the selected source location and the selected receiver location; and forming the plurality of time-windowed trace pairs by dividing the first member and the second member of the trace pair into a plurality of time segments.

9. The system of claim 8, wherein the plurality of time segments comprises a plurality of overlapping time segments wherein each sample within each overlapping time segment is multiplied by a time-varying weight.

10. The system of claim 7, wherein forming an objective function comprises:

calculating a normalized cross-correlation function between the first member and the second member of each time-windowed trace pair;

convolving a square of the normalized cross-correlation function for each time-windowed trace pair with the penalty function to form an objective function increment; and summing the objective function increments over the plurality of time-windowed trace pairs.

11. The system of claim 7, wherein determining a seismic velocity increment comprises:

simulating propagation of a seismic wave forward in time for each of a plurality of source locations;

determining an adjoint source for each of the plurality of time-windowed trace pairs;

simulating, for each of the plurality of time-windowed trace pairs, propagation of a seismic wave generated by the adjoint source backward in time;

determining a plurality of seismic velocity gradient increments using an imaging condition based, at least in part, on the forward propagated seismic wave and the backward propagated seismic wave;

obtaining a seismic velocity gradient by combining the plurality of seismic velocity gradient increments; and determining the seismic velocity increment by scaling the seismic velocity gradient based, at least in part, on the extremum of the objective function.

\* \* \* \* \*